United States Patent [19]
Moore

[11] Patent Number: 5,130,888
[45] Date of Patent: Jul. 14, 1992

[54] SPRING CLIP FASTENER FOR SURFACE MOUNTING OF PRINTED CIRCUIT BOARD COMPONENTS

[75] Inventor: Marvin F. Moore, Carrollton, Tex.

[73] Assignee: Thermalloy Incorporated, Dallas, Tex.

[21] Appl. No.: 853,909

[22] Filed: Apr. 21, 1986

Related U.S. Application Data

[63] Continuation of Ser. No. 616,000, May 31, 1984, abandoned.

[51] Int. Cl.⁵ .............................................. H05N 7/20
[52] U.S. Cl. .................................. 361/386; 165/80.3; 165/185; 357/79; 357/81
[58] Field of Search ................. 165/80 A, 80.3, 185; 176/16 HS; 211/26; 248/500, 316.7, 505, 510; 357/74, 79, 80, 81; 361/386-389, 417, 427

[56] References Cited

U.S. PATENT DOCUMENTS

| 3,533,589 | 10/1970 | Schellmann | 248/500 |
| 3,617,980 | 11/1971 | Alkire et al. | 357/81 |
| 4,575,038 | 3/1986 | Moore | 248/505 |

Primary Examiner—Gregory D. Thompson
Attorney, Agent, or Firm—Jack A. Kanz

[57] ABSTRACT

Disclosed is a spring clip fastener for mounting a heat sink and a semiconductor device package to the surface of a circuit board. The fastener includes a spring portion and support members extending from the spring portion for supporting the spring portion above the surface of the circuit board. A shoulder is internally formed in the support members so that the spring portion urges the semiconductor device package against the heat sink. Feet extend from the support members for engaging the surface of the circuit board. The feet are coated with a solder-promoting material.

6 Claims, 1 Drawing Sheet

U.S. Patent  July 14, 1992  5,130,888
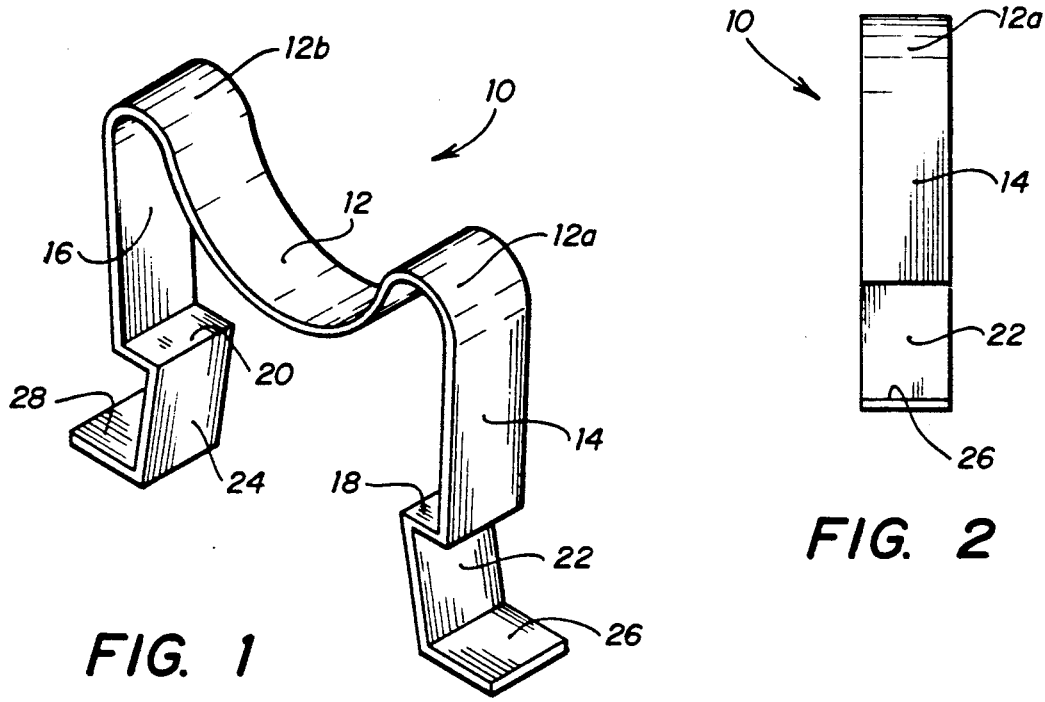
FIG. 1
FIG. 2
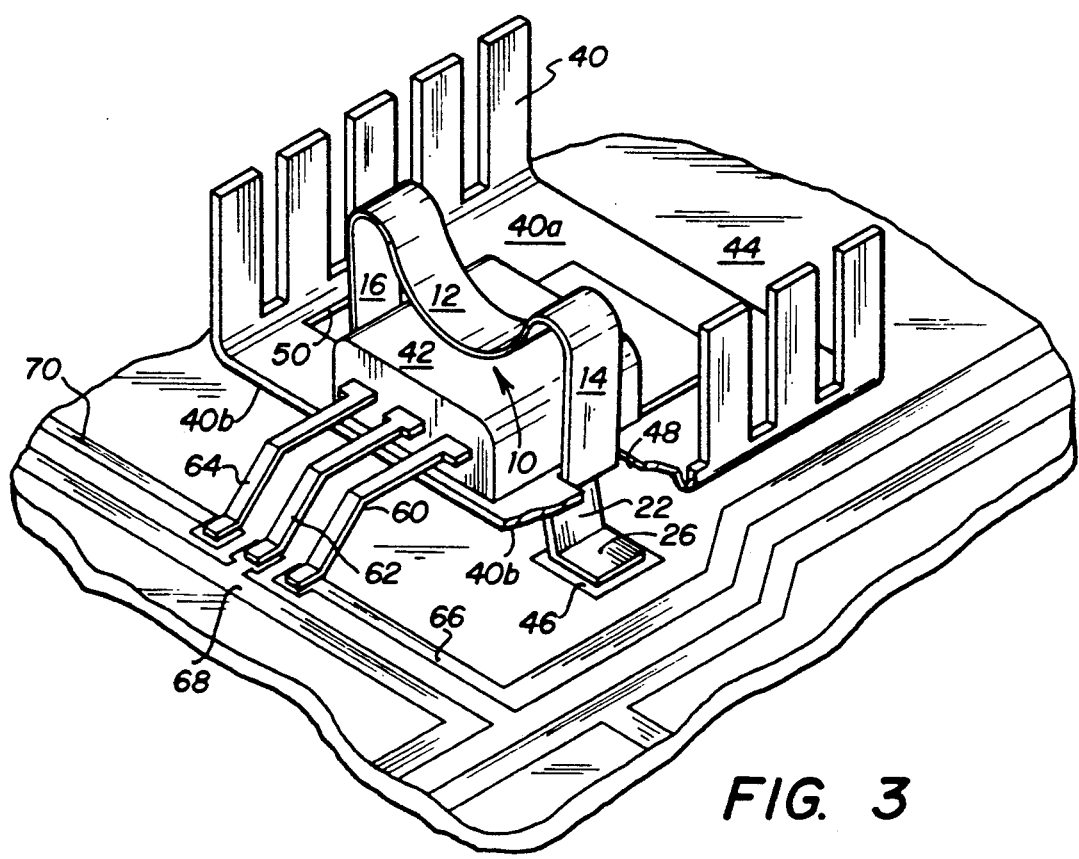
FIG. 3

SPRING CLIP FASTENER FOR SURFACE MOUNTING OF PRINTED CIRCUIT BOARD COMPONENTS

This is a continuation of application Ser. No. 06/616,00 filed May 31, 1984 entitled Spring Clip Fastner for Surface Mounting of Printed Circuit Board Components, now abandoned.

This invention relates to apparatus for assembly of components on circuit boards and the like. More particularly, it relates to apparatus for assembly and mounting of semiconductor devices and heat sinks for semiconductor devices and the like on the surfaces of printed circuit boards or other mounting substrates.

Many semiconductor devices generate heat during operation which must be dissipated to avoid damage to the device. In some devices, the heat generated is dissipated sufficiently by the enclosure, header or leads. Other devices may be mounted on heat sinks including bodies of thermally conductive materials such as, for example, copper and aluminum which dissipate the heat generated by the semiconductor devices into the surrounding environment. Such heat sinks maybe extruded, machined or include sheet metal bodies having heat dissipating fins.

Numerous mounting and fastening devices have been proposed for mounting heat sinks to printed circuit boards, for example, U.S. Pat. No. 4,388,967 issued to L. Breese on Jun. 21, 1983 and entitled "Solderable Mounting Stakes For Heat Sinks"; U.S. Pat. No. 4,403,102 issued to W. Jordan, et al. on Sep. 6, 1983 and entitled "Heat Sink Mounting"; and U.S. Pat. No. 4,054,901 issued to S. Edwards, et al. on Oct. 18, 1977 and entitled "Index Mounting Unitary Heat Sink Apparatus With Aperatures Base". Characteristic of these fastening devices is a structure for attaching the combination of a semiconductor device and a heat sink to a circuit board in which the fastening device is received by holes formed through the circuit board. The fastener can then be soldered to the bottom surface of the printed circuit board in much the same way other components such as, for example, transistors, resistors and capacitors are electrically connected to the circuit board such as, for example, wave soldering.

The fabrication of printed circuit boards as well as the assembly process of inserting components through holes in the circuit boards is a costly and time consuming process. It has been proposed that by eliminating the hole mounting requirements for components on printed circuit boards there can be a great reduction in the cost of such printed circuit boards, eliminating hole fabrication and drilling, as well as the labor required to insert components thereon. The surface mounting of components therefore has distinct advantages over present mounting techniques in which the components are inserted through the circuit board for subsequent soldering operations.

The surface mounting of electrical components on printed circuit boards necessitates that heat dissipating devices also be directly mounted to the surface of the printed circuit board to thereby eliminate the need for any mounting holes in the circuit board. A need has thus arisen for surface mounting fastener devices to accommodate the numerous heat dissipating devices such with semiconductor devices.

In accordance with the present invention, a spring clip fastener is provided for surface mounting of heat dissipating devices to the surface of printed circuit boards.

In accordance with the present invention, a fastener is provided for mounting a heat sink and semiconductor device package to the surface of a circuit board. The fastener includes a body. The central portion of the body engages the semiconductor device package. Structure extends from the body on each side of the central portion for retaining the heat sink to the semiconductor device package and for contacting the surface of the circuit board. This structure includes a surface parallel with the surface of the circuit board which is coated with a solder-promoting material.

For a more complete understanding of the present invention and the advantages thereof, reference is now made to the following detailed description taken in conjunction with the accompanying drawing in which:

FIG. 1 is a perspective view of the spring clip fastener in accordance with the present invention;

FIG. 2 is a side view of the fastener shown in FIG. 1; and

FIG. 3 is a perspective view of the fastener shown in FIG. 1 mounting a heat dissipating device and semiconductor device package to the surface of a circuit board.

Referring simultaneously to FIGS. 1 and 2, a spring clip fastener in accordance with the present invention is illustrated and generally identified by the numeral 10. Spring clip fastener 10 comprises a unitary body of material formed from a generally flat metal blank. The flat metal blank is formed to define a centrally disposed arcuate spring portion 12 whose ends 12a and 12b are formed to extend to support members 14 and 16. Support members 14 and 16 are generally vertically disposed.

Support members 14 and 16 form shoulders 18 and 20, respectively, which are disposed generally perpendicular to support members 14 and 16. Shoulders 18 and 20 are supported by support members 22 and 24, respectively. Attached to the ends of support members 22 and 24 are feet 26 and 28, respectively, which are disposed substantially parallel with shoulders 18 and 20. Spring clip fastener 10 retains a semiconductor device package and heat dissipating device between shoulders 18 and 20 and spring portion 12 so that the semiconductor device package and heat sink are supported above the surface of a circuit board by feet 26 and 28.

Spring clip fastener 10 maybe formed by conventional metal forming technique from any suitable sheet or ribbon material such as aluminum alloys and steel alloys. The material selected should exhibit sufficient strength and resiliency to permit spring portion 12 to act as a clip to firmly engage the semiconductor device package between spring portion 12 and shoulders 18 and 20 of spring clip fastener 10.

An important aspect of the present invention is that feet 26 and 28 readily accept a solder bond. Feet 26 and 28 are clad with a solderable coating material which promotes the formation of solder bonds such as tin or a tin-lead alloy. The pre-clad material may be applied by conventional pre-tinning or by plating or the like. Such pre-clad is conventionally referred to as "pre-tin" regardless of the composition of the material or the process by which it is applied and the terms "pre-tinned", "pre-tin", "tin-plated", and "tin-coated" are used interchangeably wherein to refer to solderable or solder-promoting coatings regardless of the actual composition of the coating or the manner by which the coating is applied. Feet 26 and 28 may be pre-tinned after the spring clip fastener 10 is formed as described above or spring clip fastener 10 may itself be formed for pre-tinned blank stock. Spring clip fastener 10 may be formed by metal stamping using conventional spring steel and the stamped part thereafter tin-plated.

Referring now to FIG. 3, spring clip fastener 10 may be used in connection with a variety of conventional heat sink structures and semiconductor device packages to form a solderable fastener heat sink assembly for surface mounting the heat sink and semiconductor device package to a circuit board. A typical assembly is illustrated in FIG. 3 wherein a heat sink 40 is attached to a seimconductor device package 42 using the present spring clip fastener 10 which in turn is mounted to the surface of a circuit board 44. Feet 26 and 28 lie parallel with the surface of circuit board 44 and are soldered to a solder pad 46. Spring clip fastener 10 captures semiconductor device package 42 between spring portion 12 and surface 40a of heat sink 40.

Support members 14 and 16 are disposed within apertures 48 and 50 within heat sink 40. Bottom surface 40b of heat sink 40 lies adjacent shoulders 18 and 20. Semiconductor device package 42 includes leds 60, 62 and 64 which are soldered to circuit board lines 66, 68 and 70, respectively. Support members 22 and 24 allow for mounting of heat sink 40 a predetermined distance above the surface of circuit board 44 to thereby allow for proper air flow around heat sink 40 and for washing of flux and other debris from circuit board 44 after soldering.

As shown in FIG. 3, semiconductor device package 42 corresponds to a JEDEC TO-220 plastic power package and is shown for illustrative purposes only, it being understood that other semiconductor device packages can be utilized with the present spring clip fastener 10 as well as other heat sinks.

The fastener of the present invention may also be attached to the surface of the printed circuit board using a thermally conductive adhesive such as, for example, filled epoxies and an aerobics in lieu of soldering.

It therefore can be seen that the present fastener allows for the surface mounting of a semiconductor device and heat sink to a circuit board. Since feet 26 and 28 are pre-tinned, the entire assembly may be physically and electrically connected to circuit board 44 in a single operation such as, for example, by passing the assembly through a hot vaporization chamber to thereby heat the solder on solder pad 46.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. The combination comprising:
   (a) a semiconductor device package;
   (b) a heat sink;
   (c) a circuit board; and
   (d) unitary fastening means maintaining said heat sink and said semiconductor device package in intimate mutual contact and securing the heat sink and semiconductor device package in a fixed position spaced from the surface of said circuit board, said unitary fastening means comprising:
   (i) an elongated unitary body;
   (ii) spring means integral with and substantially centrally disposed in said body engaging said semiconductor device package and urging said semiconductor device package into contact with said heat sink;
   (iii) support means extending from said spring means and supporting said spring means, said heat sink and said semiconductor device package above the surface of said circuit board;
   (iv) shoulder means integrally formed in said support means engaging said heat sink and supporting said heat sink above the surface of said circuit board and also retaining said heat sink in fixed position with respect to said spring means and said semiconductor device package; and
   (v) foot means coated with solder-promoting material and extending from said support means, the surface of said foot means spaced from said shoulder means and disposed parallel with the surface of said circuit board and secured to the surface of said circuit board.

2. A unitary assembly device for securing a heat sink and a semiconductor device package in intimate mutual contact and for securing the assembly of said heat sink and said semiconductor device package to the surface of a circuit board, said assembly device comprising:
   (a) an elongated unitary body;
   (b) spring means integral with and substantially centrally disposed in said body adapted for engaging a semiconductor device package and urging said semiconductor device package into contact with a heat sink;
   (c) support means extending from said spring means supporting said spring means and adapted to support the assembly of said semiconductor device package and said heat sink above the surface of a circuit board;
   (d) foot means coated with solder-promoting material and extending from said support means, the surface of said foot means adapted to be disposed parallel with the surface of said circuit board and to engage the surface of said circuit board and support said assembly in a fixed position spaced from the surface of said circuit board; and
   (e) shoulder means integrally formed in said support means between said foot means and said spring means and spaced from both said spring means and said foot means for engaging and supporting said heat sink above the surface of said circuit board and for retaining said heat sink in fixed position with respect to said spring means and said semiconductor device package.

3. A unitary assembly device as defined in claim 2 wherein said spring means is arcuate in shape having first and second ends.

4. A unitary assembly device as defined in claim 3 wherein said support means extends from said first and second ends of said spring means.

5. Apparatus comprising:
   (a) an elongated unitary body;
   (b) spring means integral with and substantially centrally disposed in said body adopted for engaging a semiconductor device package and urging said semiconductor device package into contact with a heat sink;
   (c) support means extending from said spring means for supporting said spring means and the assembly of said semiconductor device package and said heat sink above the surface of a circuit board;

(d) foot means coated with solder-promoting material and extending from said support means, the surface of said foot means adapted to be disposed parallel with the surface of said circuit board and to engage the surface of said circuit board and support the assembly of said semiconductor device package and said heat sink in a fixed position spaced from the surface of said circuit board; and (e) shoulder means integrally formed in said support means between said foot means and said spring means and spaced from both said spring means and said foot means for engaging and supporting said heat sink above the surface of said circuit board and for retaining said heat sink in fixed position with respect to said spring means and said semiconductor device package.

6. A fastening device for maintaining a heat sink and a semiconductor device package in intimate mutual contact and for securing the assembly of said heat sink and said semiconductor device package in a fixed position spaced from the surface of a circuit board, said fastening device comprising:

(a) an elongated unitary body;

(b) spring means integral with and substantially centrally disposed in said body adapted for engaging a semiconductor device package and urging said semiconductor device package into contact with a heat sink;

(c) support means extending from said spring means supporting said spring means and adapted to support the assembly of said heat sink and said semiconductor device package above the surface of a circuit board;

(d) shoulder means integrally formed in said support means adapted for engaging said heat sink and for supporting said heat sink above the surface of said circuit board and also for retaining said heat sink in fixed position with respect to said spring means and said semiconductor device package; and (e) foot means coated with solder-promoting material and extending from said support means, the surface of said foot means spaced from said shoulder means and adapted to be disposed parallel with the surface of said circuit board and to be secured to the surface of said circuit board.

* * * * *

UNITED STATES PATENT AND TRADEMARK OFFICE
CERTIFICATE OF CORRECTION

PATENT NO. : 5,130,888
DATED : June 14, 1992
INVENTOR(S) : Marvin F. Moore

It is certified that error appears in the above-identified patent and that said Letters Patent is hereby corrected as shown below:

Column 1, line 2, change "06/616,00" to read ---06/616,000---
Column 2, line 65, change "wherein" to read ---herein---
Column 3, line 40, change "an aerobics" to read ---anaerobics---

Signed and Sealed this

Tenth Day of August, 1993

Attest:

MICHAEL K. KIRK

Attesting Officer

Acting Commissioner of Patents and Trademarks